United States Patent
Nishimoto et al.

(10) Patent No.: US 9,966,353 B2
(45) Date of Patent: May 8, 2018

(54) POWER MODULE SUBSTRATE, METHOD OF PRODUCING SAME, AND POWER MODULE

(71) Applicant: MITSUBISHI MATERIALS CORPORATION, Tokyo (JP)

(72) Inventors: Shuji Nishimoto, Okegawa (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days. days.

(21) Appl. No.: 15/037,186

(22) PCT Filed: Dec. 22, 2014

(86) PCT No.: PCT/JP2014/083885
§ 371 (c)(1),
(2) Date: May 17, 2016

(87) PCT Pub. No.: WO2015/098825
PCT Pub. Date: Jul. 2, 2015

(65) Prior Publication Data
US 2016/0293562 A1    Oct. 6, 2016

(30) Foreign Application Priority Data
Dec. 25, 2013    (JP) ................................ 2013-267199

(51) Int. Cl.
*H01L 23/48* (2006.01)
*H01L 23/52* (2006.01)
(Continued)

(52) U.S. Cl.
CPC .......... *H01L 24/29* (2013.01); *H01L 23/3735* (2013.01); *H01L 24/83* (2013.01);
(Continued)

(58) Field of Classification Search
None
See application file for complete search history.

(56) References Cited

U.S. PATENT DOCUMENTS

| 5,328,751 A | 7/1994 | Komorita et al. |
| 2004/0041204 A1* | 3/2004 | Ireland .............. H01L 21/32051 257/319 |

(Continued)

FOREIGN PATENT DOCUMENTS

| JP | 05-136290 A | 6/1993 |
| JP | 2004-172378 A | 6/2004 |

(Continued)

OTHER PUBLICATIONS

International Search Report dated Mar. 31, 2015, issued for PCT/JP2014/083885 and English translation thereof.

*Primary Examiner* — Sitaramarao S Yechuri
(74) *Attorney, Agent, or Firm* — Locke Lord LLP; James E. Armstrong, IV; Nicholas J. DiCeglie, Jr.

(57) ABSTRACT

An elongated trench (35) is formed so as to connect the Ag layer (32) and the exposed part of the circuit layer stretching out around the Ag layer (32). The trench (35) a narrow and elongated recessed part penetrating the glass layer (31) and the aluminum oxide film (12A) from the Ag layer (32) to reach the surface (12a) of the circuit layer (2). The extended part (36), which is a part of the Ag layer (32) flatted along with the inner surface (35a) of the trench (35), is formed in the trench (35). The Ag layer (32) and the circuit layer (12) are electrically connected directly by Ag with a low electric resistance value by the extended part (36) in the portion where the trench (35) is formed.

12 Claims, 6 Drawing Sheets

(51) Int. Cl.
*H01L 23/00* (2006.01)
*H01L 23/373* (2006.01)
*H01L 23/473* (2006.01)

(52) U.S. Cl.
CPC ............ *H01L 23/473* (2013.01); *H01L 24/32* (2013.01); *H01L 2224/29111* (2013.01); *H01L 2224/29139* (2013.01); *H01L 2224/32225* (2013.01); *H01L 2224/8384* (2013.01); *H01L 2224/83439* (2013.01); *H01L 2924/13055* (2013.01)

(56) References Cited

U.S. PATENT DOCUMENTS

| | | | |
|---|---|---|---|
| 2004/0183484 A1* | 9/2004 | Ide | G02F 1/13452 315/366 |
| 2010/0224396 A1* | 9/2010 | Nomiya | H05K 3/4629 174/258 |
| 2010/0330862 A1* | 12/2010 | Hara | G02F 1/1303 445/24 |
| 2012/0305296 A1* | 12/2012 | Gordon | H01L 23/15 174/255 |
| 2014/0332067 A1* | 11/2014 | Graddy, Jr. | H01B 1/22 136/256 |
| 2014/0374629 A1* | 12/2014 | Huang | H04B 10/802 250/551 |

FOREIGN PATENT DOCUMENTS

| | | |
|---|---|---|
| JP | 2006-202938 A | 8/2006 |
| JP | 2006-310779 A | 11/2006 |
| JP | 2008-208442 A | 9/2008 |
| JP | 2009-267374 A | 11/2009 |
| JP | 2010-287869 A | 12/2010 |
| JP | 2012-109315 A | 6/2012 |
| JP | 2012-182279 A | 9/2012 |
| JP | 2013-012706 A | 1/2013 |

* cited by examiner

POWER MODULE SUBSTRATE, METHOD OF PRODUCING SAME, AND POWER MODULE

TECHNICAL FIELD

The present invention relates to a power module substrate in which a circuit layer is formed on one surface of an insulating layer, a method of producing the power module substrate in which a semiconductor element is bonded on the circuit layer, and a power module.

Priority is claimed on Japanese Patent Application No. 2013-267199, filed on Dec. 25, 2013, the content of which is incorporated herein by reference.

BACKGROUND ART

Among various semiconductor elements, the amount of heat generated is large in a high power control power element, which is used for controlling electric automobiles, electric vehicles and the like, for example. As a substrate on which one of these high power control power elements is mounted, a power module substrate is widely used in the past. In the power module substrate, a highly conductive metal plate is bonded on a ceramics substrate such as one made of AlN (aluminum nitride) as a circuit layer.

In the conventionally used power module substrate, the semiconductor element that is the power element is mounted on the circuit layer through a solder material (for example, refer Patent Literature 1 (PTL 1)).

As the metal constituting the circuit layer, aluminum, aluminum alloy, cupper, and copper alloy are commonly used.

When the circuit layer is made of aluminum, it is hard to bond to the solder material effectively since the naturally formed oxide layer is formed on the surface of aluminum. In addition, when the circuit layer is made of copper, there is a problem that the conductivity of the circuit layer is deteriorated due to penetration of the composition of the solder material in the circuit layer after reaction between the melted solder material and copper.

On the other hand, as a bonding method free of the use of the solder material, the method, in which the semiconductor element is bonded by using a Ag nanopaste, is proposed in Patent Literature 2 (PTL 2), for example.

In addition, methods, in which the semiconductor is bonded by using oxide pastes including metallic oxide particles and a reducing agent made of an organic compound without using the solder material, are proposed in Patent Literatures 3 and 4 (PTL 3 and PTL 4), for example.

However, when the semiconductor is bonded by using the Ag nanopaste without using the solder material, a bonding layer of the Ag nanopaste thinner than one formed with the solder material is formed as disclosed in PTL 2. Therefore, the stress during loading thermal cycles becomes more likely to be placed on the semiconductor and the semiconductor itself is broken down occasionally.

Similarly, when the semiconductor is bonded by using the metallic oxide and the reducing agent, the sintered layer of the oxide paste is thinly formed as disclosed in PTLs 3 and 4. Therefore, the stress during loading thermal cycles becomes more likely to be placed on the semiconductor and the performance of the power module is deteriorated occasionally.

Under the circumstance explained above, methods, in which the circuit layer and the semiconductor are bonded through the solder material or the Ag paste after forming a sintered Ag layer on the circuit layer made of aluminum or copper by using a glass-containing Ag paste, are proposed in Patent Literatures 5-7 (PTLs 5-7), for example. In these methods, the glass-containing Ag paste is applied on the surface of the circuit layer made of aluminum or copper; and subjected to sintering. By following the process, the oxide film formed on the circuit layer is removed since the oxide film reacts with the glass; and the sintered Ag layer is formed. Accordingly, the semiconductor element is bonded on the circuit layer, on which the sintered Ag layer is formed, through the solder material.

This sintered Ag layer has the glass layer, which is formed by the reaction between the glass and the oxide film of the circuit layer; and the Ag layer formed on the glass layer. In this glass layer, conductive particles are dispersed; and conduction of the glass layer is retained by these conductive particles.

CITATION LIST

Patent Literature

PTL 1: Japanese Unexamined Patent Application, First Publication No. 2004-172378 (A)
PTL 2: Japanese Unexamined Patent Application, First Publication No. 2008-208442 (A)
PTL 3: Japanese Unexamined Patent Application, First Publication No. 2009-267374 (A)
PTL 4: Japanese Unexamined Patent Application, First Publication No. 2006-202938 (A)
PTL 5: Japanese Unexamined Patent Application, First Publication No. 2010-287869(A)
PTL 6: Japanese Unexamined Patent Application, First Publication No. 2012-109315
PTL 7: Japanese Unexamined Patent Application, First Publication No. 2013-012706 (A)

SUMMARY OF INVENTION

Technical Problem

In order to improve the bonding reliability between the circuit layer and the sintered Ag layer, it is effective to increase the content amount of the glass in the glass-containing Ag paste.

However, if the content amount of the glass in the glass-containing Ag paste were increased, the glass layer of the sintered Ag layer would become thick. Even though conductive particles are dispersed in the glass layer, its electrical resistance is higher than the Ag layer or the like. Therefore, the thicker the glass layer, the higher the electric resistance value of the sintered Ag layer. This trend makes it difficult to balance both of the bonding reliability and the electric resistance value. As explained above, in the case where the electric resistance value of the sintered Ag value is high, occasionally, proper electric connection between the circuit layer and the semiconductor element cannot be obtained when the circuit layer in which the sintered Ag layer is formed; and the semiconductor element are bonded through the solder material or the like.

The present invention is made under the above-described circumstances. The purpose of the present invention is to provide a power module substrate capable of reducing the electric resistance value between: a semiconductor element, which is bonded through the sintered Ag layer including the glass layer formed on the circuit layer and the Ag layer; and the circuit layer. In addition, a method of producing the power module; and power module are provided.

Solution to Problem

In order to solve the problem described above, the present invention provides the power module substrate; the method of producing the power module substrate; and the power module described below.

An aspect of the present invention is a power module substrate including: a circuit layer formed on one surface of an insulating layer; and a sintered Ag layer formed on the circuit layer, wherein the sintered Ag layer is made of a glass layer and a Ag layer formed on the glass layer, a trench connecting the Ag layer and the circuit layer is formed, and the Ag layer has an extended part extending to the circuit layer along with an inner surface of the slot, and the extended part electrically connects the Ag layer and the circuit layer.

According to the power module substrate of the aspect of the present invention, the trench is formed in such a way that the Ag layer and the exposed part of the circuit layer stretching around the periphery of the Ag layer are connected. The extended part, which is made of Ag extended from the Ag layer constituting the sintered Ag layer, is formed on the inner surface of this slot. By this extended part, the Ag layer and the circuit layer can be electrically connected.

Ag constituting this extended part has a lower electric resistance value than the glass layer in which conductive particles are dispersed. Thus, the electrical resistance between the circuit layer and the Ag layer is reduced; and electricity can be flown effectively, even though the glass layer having a relatively high resistance is formed as the sintered Ag layer. Because of this, the electric resistance value between the Ag layer and the circuit layer can be kept at a low value, even if the glass layer became thick by increasing the content amount of the glass in order to improve the bonding reliability between the circuit layer and the sintered Ag layer. Accordingly, both of the bonding reliability and the electric resistance value can be balanced.

In the power module substrate, the trench may be formed to connect a peripheral region of the Ag layer and the circuit layer, the peripheral region being a region stretching out from an element bonding region of the Ag layer on which a semiconductor element is provided.

By having the configuration described above, the electric resistance value between the Ag layer and the circuit layer can be reduced while the bonding reliability of the semiconductor is retained at a high level, since the trench is not formed on the part where the semiconductor and the sintered Ag layer are overlapped.

In the power module substrate, the trench may reach to a location deeper than an oxide film formed on the circuit layer.

By having the configuration described above, the electric resistance value between the Ag layer and the circuit layer can be reduced further, since conduction between the circuit layer, which is located below the high-resistance oxide film existing on the surface of the circuit layer; and the Ag layer, is retained by the extended part made of Ag.

In the power module substrate, he sintered Ag layer may be in a substantially rectangular shape in a planar view, and the trench is formed on each of four sides of the Ag layer.

By having the configuration described above, the electric resistance value between the Ag layer and the circuit layer can be reduced evenly over the entire sintered Ag layer, which is in a substantially rectangular shape, without unevenness.

In the power module substrate, a length of the trench along with an extension direction thereof may be 0.3 mm or more and 5.0 mm or less.

By setting the length of the trench to 0.3 mm or more, the electric resistance value between the Ag layer and the circuit layer can be reduced with certainty. In addition, by setting the length of the trench to 5.0 mm or less, the bonding reliability between the sintered Ag layer and the circuit layer can be kept at a high level.

In the power module substrate, a depth of the trench along with a thickness direction thereof may be 10 μm or more and 200 μm or less.

By setting the depth of the trench to 10 μm or more, the electric resistance value between the Ag layer and the circuit layer can be reduced with certainty. In addition, by setting the depth of the trench to 200 μm or less, the bonding reliability between the sintered Ag layer and the circuit layer can be kept at a high level.

In the power module substrate, a width of the trench in a right angle to the extension direction thereof may be 5% or more and 75% or less of a length of the side of the sintered Ag layer on which the trench is formed.

By having the configuration described above, the bonding reliability between the sintered Ag layer and the circuit layer can be kept at a high level while the electric resistance value between the Ag layer and the circuit layer is reduced.

In the power module substrate, an electric resistance value of the sintered Ag layer in a thickness direction thereof may be 10 mΩ or less.

By reducing the electric resistance value by the configuration described above, a power module with a reduced current loss can be obtained.

Other aspect of the present invention is a power module including: the power module substrate of the above-described aspect of the present invention; and a semiconductor element provided on one surface side of the sintered Ag layer constituting the power module substrate, wherein the semiconductor element is bonded to the sintered Ag layer through a bonding layer.

According to the power module of the other aspect of the present invention, the trench is formed in such a way that the Ag layer and the exposed part of the circuit layer stretching out around the periphery of the Ag layer are electrically connected to electrically connect the Ag layer and the circuit layer by the extended part made of Ag in the inner surface of the slot. Because of this, the electric resistance value between the circuit layer and the Ag layer is reduced even if the glass layer with a relatively high resistance is formed as a sintered Ag layer. Thus, the electric resistance value between the semiconductor and the circuit layer can be kept at a low value.

In the power module of the other aspect of the present invention, a thermal resistance increase rate may be less than 2% in a power cycle test in which 200,000 times of power cycles are loaded, each of the power cycles being performed in a condition of: 5 seconds of energization time; and 80° C. of temperature difference.

In the case where power cycles are loaded repeatedly on a power module, when there is a part with a high electric resistance locally in the bonding layer between the semiconductor and the circuit layer, partial melting occurs; and melting and coagulation occur repeatedly at the part. In this case, cracks are formed in the bonding layer or the sintered Ag layer due to the partially melted part being a starting point of the cracks, causing a problem of increased thermal resistance. In the present invention, the thermal load on the bonding layer and the sintered Ag layer is suppressed even if power cycles are repeatedly loaded on the power module, since the electric resistance value between the semiconductor and the circuit layer is kept at a low value as described above. Thus, the bonding layer and the sintered Ag layer are not broken down in the early stage; and reliability against power cycles can be improved. The above-described power cycle test is performed in the condition that the highest load is subjected to the bonding layer and the sintered Ag layer. Thus, if the thermal resistance increase rate were less than 2% in the power cycle test in which 200,000 times of power cycles are loaded, a sufficient reliability can be obtained in the normal use.

Other aspect of the present invention is a method of producing a power module substrate having a circuit layer, which is formed on one surface of an insulating layer, and a sintered Ag layer formed on the circuit layer, the method including at least the steps of applying a glass-containing Ag paste on one surface of the circuit layer; sintering the Ag paste to form a sintered Ag layer made of a glass layer and a Ag layer formed on the glass layer; and forming a trench connecting the Ag layer to the circuit layer, wherein an extended part is formed in such a way that a part of the Ag layer is pulled along with an inner surface of the trench in the step of forming a trench to electrically connect the Ag layer and the circuit layer with the extended part.

According to the method of producing the power module substrate of the other aspect of the present invention, by having the step of forming a trench in such a way that the Ag layer and the exposed part of the circuit layer stretching out around the periphery of the Ag layer are connected, the extended part, which is made of Ag extended from the Ag layer constituting the sintered Ag layer, is formed on the inner surface of this slot. By this extended part, the Ag layer and the circuit layer can be electrically connected.

Since the Ag has a lower electrical resistance value than the glass layer in which conductive particles are dispersed, the electric resistance between the circuit layer and the Ag layer is reduced; and electricity can be flown effectively, even if the glass layer having a relatively high resistance is formed as the sintered Ag layer. Because of this, the method of producing the power module substrate capable of reducing the electric resistance between the circuit layer and the Ag layer can be provided.

In the method of producing a power module substrate of the other aspect of the present invention, a linear scribe line may be formed from the one surface of the Ag layer toward the circuit layer in such a way that the Ag layer is indented in the step of forming a slot.

By having the configuration described above, the slot, which connects the Ag layer and the circuit layer; and the extended part, which is made of Ag in the inner surface of the slot, can be formed easily at the same time, simply by forming the scribe line from the Ag layer to the circuit layer with a jig or the like having a pointed tip.

Advantageous Effects of Invention

According to the present invention, a power module substrate capable of reducing the electric resistance value between the semiconductor and the circuit layer, which are bonded through the sintered Ag layer formed on the circuit layer; a method of producing the power module substrate; and a power module including the power module substrate can be provided.

DESCRIPTION OF EMBODIMENTS

Figure 1:
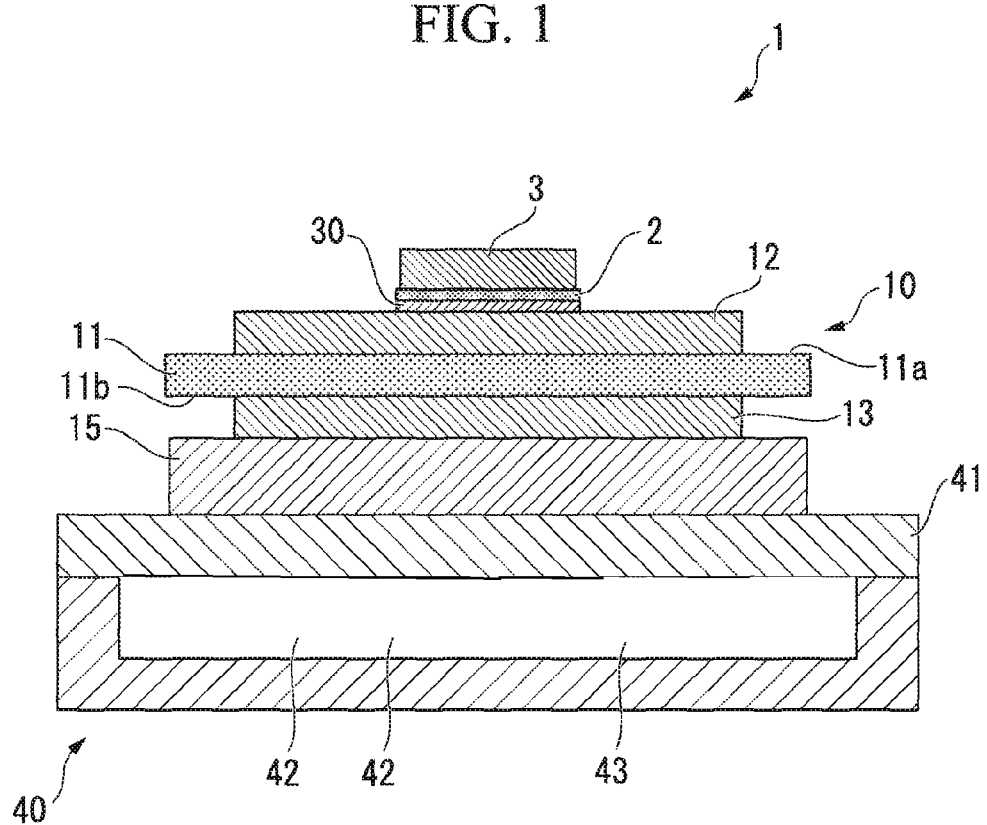
FIG. 1 is a cross sectional view showing the power module related to an embodiment of the present invention.

The power module substrate; the method of producing the power module substrate; and the power module of the present invention, are explained in reference to drawings below. Each of embodiments described below is for specific explanations for better grasping of the idea of the present invention; and does not limit the present invention unless otherwise stated. In addition, in the drawings used in the explanations below, there is a case where a part corresponding to a main section is shown as an enlarged view in order to make it easy to understand the feature of the present invention for convenience. In this case, size ratios or the like of each components are not necessarily be the same as ones of the real components.

FIG. 1 is a cross sectional view showing the power module related to an embodiment of the present invention.

The power module 1 in the present embodiment has the power module substrate 10 on which the circuit layer 12 is provided; the semiconductor chip (semiconductor element) 3 bonded to the surface of the circuit layer 12 through the bonding layer 2; and the cooler 40.

The power module substrate 10 has: the ceramics substrate 11 constituting the insulating layer; the circuit layer 12 provided on one surface 11a (the upper surface in FIG. 1) of the ceramics substrate 11; and the metal layer 13 provided on other surface 11b (the lower surface in FIG. 1) of the ceramics substrate 11.

The ceramics substrate 11 is for preventing the circuit layer 12 and the metal layer 13 from being electrically connected. For example, it may be constituted of a material having high insulating property such as AlN (aluminum nitride), $Al_2O_3$ (aluminum oxide), $Si_3N_4$ (silicon nitride) or the like. In the present embodiment, AlN is used. In addition, the thickness of the ceramics substrate 11 is set within the range of 0.2 mm to 1.5 mm, and it is set to 0.635 mm in the present embodiment as an example.

The circuit layer 12 is formed by bonding the conductive metal plate to the one surface 11a of the ceramics substrate 11. For the material of the circuit layer, Al, alloy including Al, Cu, and the like can be named. In the present embodiment, the circuit layer 12 is formed by bonding the aluminum plate, which is made of the rolled plate of aluminum having purity of 99.99 mass % or more (so called 4N aluminum), to the ceramics substrate 11, for example.

The metal layer 13 is formed by bonding the metal plate to the other surface 11b of the ceramics substrate 11. In the present embodiment, the metal layer 13 is formed by bonding the aluminum plate, which is made of the rolled plate of aluminum having purity of 99.99 mass % or more (so called 4N aluminum), to the ceramics substrate 11 as in the circuit layer 12, for example.

The cooler 40 is for cooling the entire power module 1 by propagating heat generated in the above-described power module substrate 10 to dissipate heat. The cooler 40 has the top plate part 41 bonded to the power module substrate 10; the heat radiating fins 42, which are vertically suspended downward from the top plate part 41; and the passage 43 for flowing cooling medium (for example, cooling water). It is preferable that the cooler 40 (the top plate part 41) is constituted of a material having excellent thermal conductivity. It is constituted of A6063 alloy (aluminum alloy) in the present embodiment, for example.

In addition, the buffer layer 15, which is made of aluminum, aluminum alloy, or a composite material including aluminum (AlSiC or the like, for example), is provided between the top plate part 41 of the cooler 40 and the metal layer 13 in the present embodiment.

On the surface 12a (the upper surface in FIG. 1) of the circuit layer 12, the sintered Ag layer 30, which is obtained by sintering the Ag paste described later, is formed. On the surface 12a of the sintered Ag layer 30, the semiconductor chip 3 is bonded through the bonding layer 2.

As the bonding layer 2, the solder layer is named, for example. As the solder material constituting the solder layer, Sn—Ag solder, Sn—In solder, and Sn—Ag—Cu solder can be named, for example.

As shown in FIG. 1, the sintered Ag layer 30 is not formed on the entire top surface of the circuit layer 12. It is only needed to be selectively formed on the portion that the semiconductor chip 3 is provided; and the aluminum plate is exposed in the peripheral part constituting the circuit layer 12.

The power module 1 of the present embodiment is configured in such a way that the thermal resistance increase rate is less than 2% in the power cycle test in which 200,000 times of power cycles are loaded. Each of the power cycles is performed in the condition of: 5 seconds of energization time; and 80° C. of temperature difference.

Figure 2:
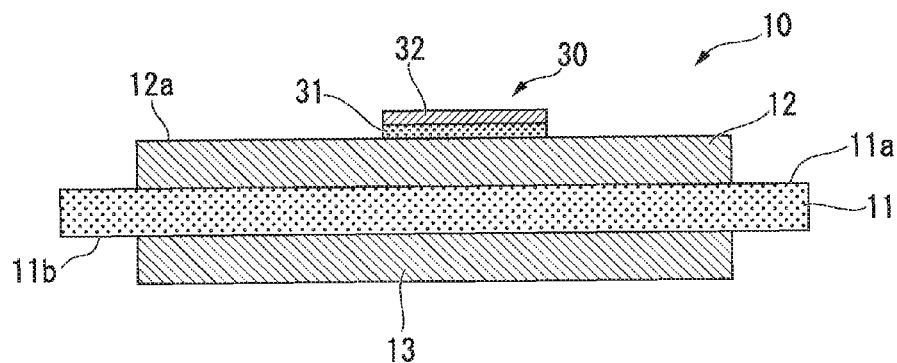
FIG. 2 is a cross sectional view showing the power module substrate of an aspect of the present invention.
Figure 3:
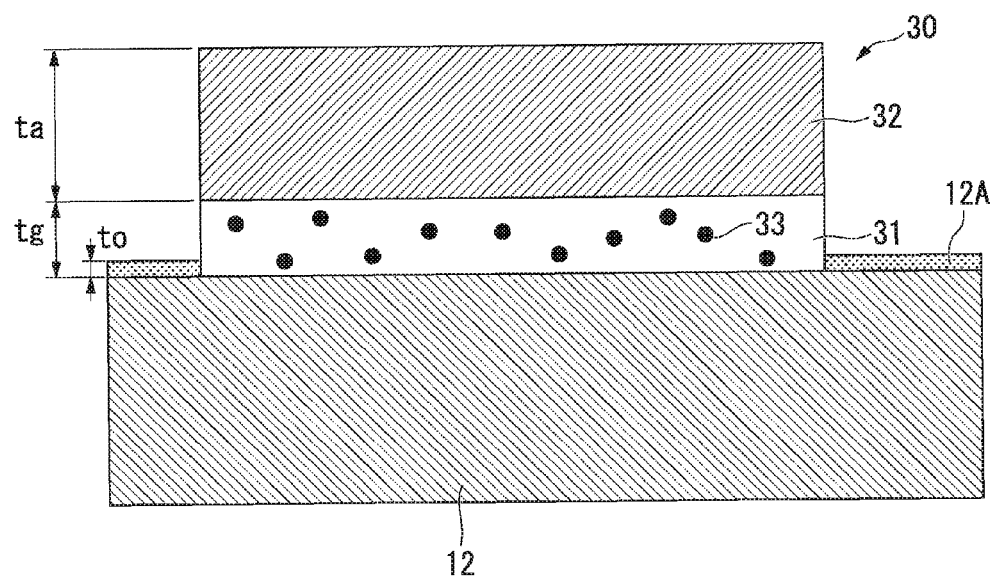
FIG. 3 is an enlarged explanatory view of the main section of the bonding part between the sintered Ag layer and the circuit layer.

More specifically, an IGBT element is soldered on the circuit layer 12 as the semiconductor chip 3; and connection wirings made of aluminum alloy are bonded to the circuit layer 12. Then, energization to the IGBT element is set in such a way that the cycle, which results in the element surface temperature of 140° C. during the energized state (ON) and that of 60° C. during the non-energized state (OFF), is repeated every 10-seconds. In the power module 1, the thermal resistance increase rate is less than 2% after repeating the power cycles 200,000 times FIGS. 2 and 3 are cross sectional views showing the power module substrate 10 before bonding the semiconductor chip 3 through the bonding layer 2.

In the power module substrate 10, the above-described sintered Ag layer 30 is formed on the surface 12a (the upper surface in FIGS. 2 and 3) of the circuit layer 12. The sintered Ag layer 30 has the glass layer 31 formed on the side of the circuit layer 12; and the Ag layer 32 formed on the glass layer 31 in the state before bonding the semiconductor chip 3 through the bonding layer 2 as shown in FIG. 3. Inside of the glass layer 31, the fine conductive particles 33, particle sizes of which are about several nanometers, are dispersed. These conductive particles 33 are crystalline particles including at least one of Ag and Al, for example.

The circuit layer 12 is made of aluminum having purity of 99.99 mass %. However, the surface (the upper surface in FIG. 3) of the circuit layer 12 is covered by aluminum oxide film (oxide film: $Al_2O_3$) 12A, which is naturally formed in the air. However, the aluminum oxide film 12A is removed in the part where the above-described sintered Ag layer 30 is formed due to the reaction with the glass during formation of the sintered Ag layer 30.

Therefore, the sintered Ag layer 30 is formed directly on the circuit layer 12 free of interposition of the aluminum oxide film 12A in the part (the overlapping part with the sintered Ag layer 13 among the circuit layer 12). In other words, the aluminum constituting the circuit layer 12 and the glass layer 31 are bonded directly.

Figure 4:
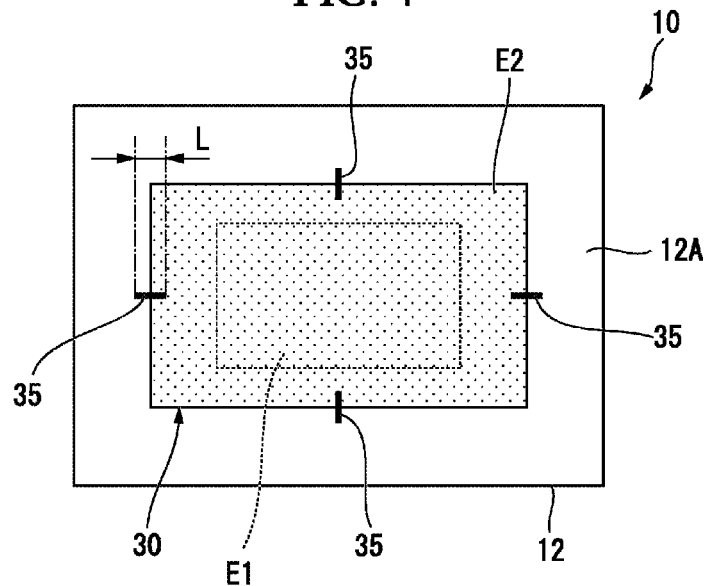
FIG. 4 is a plan view in the case where the power module substrate of an aspect of the present invention is viewed from the top.

FIG. 4 is a plan view in the case where the power module substrate 10 is viewed from the top before bonding the semiconductor chip 3 through the bonding layer 2.

The sintered Ag layer 30 is formed on a part of the circuit layer 12 in such a way that the sintered Ag layer 30 to be in a substantially rectangular shape, such as an oblong rectangular shape, in the plan view from the top. The circuit layer 12 is covered by the aluminum oxide film 12A in the exposed part around the part the sintered Ag layer 30 is formed.

The vicinity of the center of the sintered Ag layer 30 is the element bonding region E1 that is the region the semiconductor chip 3 is bonded through the bonding layer 2. On the other hand, the peripheral region E2 stretching out around the periphery of the element bonding region E1 is in the state where the Ag layer 32 is exposed even after bonding of the semiconductor chip 3.

Then, the narrow trenches 35 are formed in such a way that the peripheral region E2 of the sintered Ag layer 30; and the exposed part of the circuit layer 12 stretching out around the periphery of the sintered Ag layer 30, are connected. In terms of the trenches 35, it is preferable that four trenches 35, 35 . . . , are formed in total, for example. In this case, one trench 35 is formed in the middle of each of four sides of the sintered Ag layer in the rectangular shape in a plan view.

Figure 5:
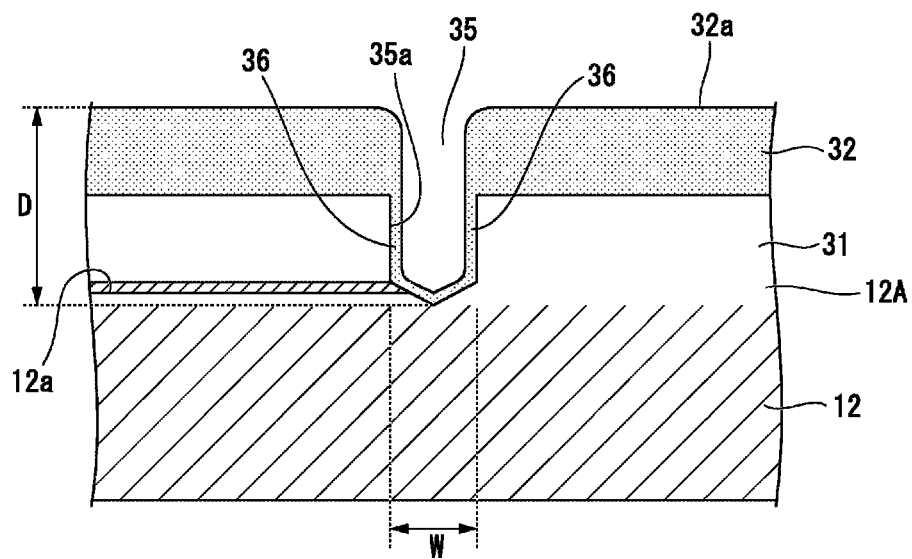
FIG. 5 is an enlarged cross sectional view of the main section showing the slot-formed part.

FIG. 5 is an enlarged cross sectional view of the main section showing the part in which the trench is formed on the sintered Ag layer. The trenches 35 formed on each of the four sides of the sintered Ag layer 30 are narrow recessed parts reaching to the surface 12a of the circuit layer 12 from the surface 32a (the upper surface in FIG. 5) of the Ag layer 32 penetrating through the glass layer 31 and the aluminum oxide film 12A.

The trench 35 is formed in such a way that the length L (refer FIG. 4) of the trench along with the extension direction thereof (the longitudinal direction) is 0.3 mm or more and 5.0 mm or less. In addition, the trench 35 is formed in such a way that the depth D of the trench along with the thickness direction thereof is 10 μm or more and 200 μm or less. The depth D of the trench 35 is appropriately adjusted based on the thicknesses of the glass layer 31 and the Ag layer 32, both of which constitute the sintered Ag layer 30.

In addition, the trench 35 is formed in such a way that the width of the trench in the right angle to the extension direction thereof is 5% or more and 75% or less of the length of the side of the sintered Ag layer 30 on which the trench 35 is formed.

In each of the trenches 35, the extended part 36, which is a part of Ag layer 32 flatted along with the inner surface 35a of the slot, is formed. The extended part 36 is formed by pulling Ag, which constitutes the Ag layer 32 and is relatively soft metal, with a jig during formation of the trench 35. It extends from the Ag layer 32 and reaches to the surface 12a of the circuit layer 12. By the extended part 36, the Ag layer 32; and the circuit layer 12 are electrically connected directly by Ag, which has a low electric resistance value in the slot-formed part. The method of forming the trench 35 will be explained later.

By connecting the Ag layer 32 and the circuit layer 12 electrically by Ag as explained above using the extended part 36 formed on the trench 35, the electric resistance value P in the thickness direction of the sintered Ag layer 30 becomes 10 Ωm or less, for example.

Figure 6:
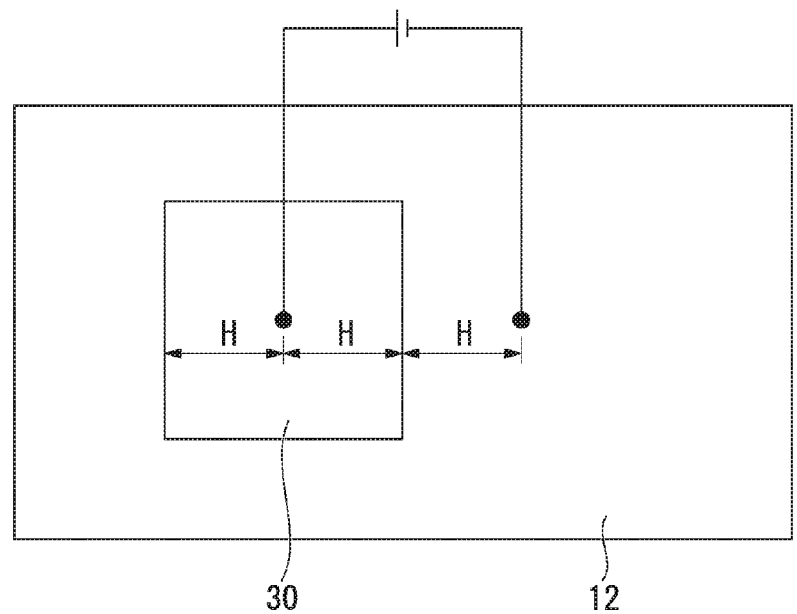
FIG. 6 is a top surface explanatory diagram showing the measurement method of the electric resistance value P in the thickness direction of the sintered Ag layer.
Figure 7:
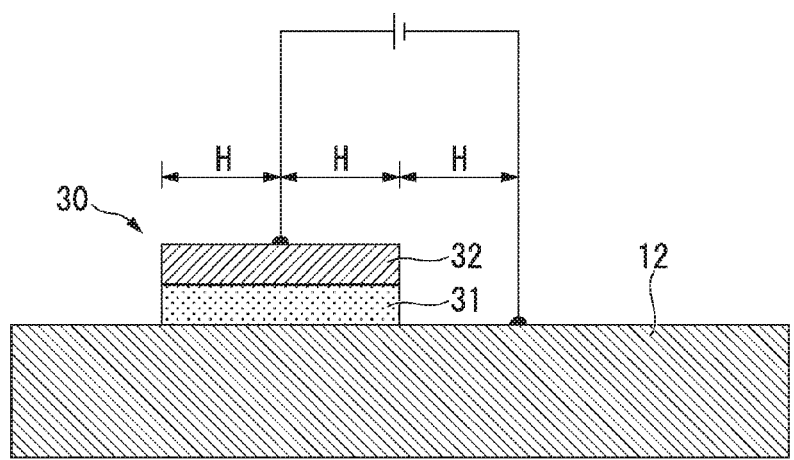
FIG. 7 is a side surface explanatory diagram showing the measurement method of the electric resistance value P in the thickness direction of the sintered Ag layer.

In the present embodiment, the electric resistance value P in the thickness direction of the sintered Ag layer 30 is defined as the electric resistance value between the upper surface of the sintered Ag layer 30 and the upper layer of the circuit layer 12. The reason for this definition is that the electric resistance of 4N aluminum constituting the circuit layer is extremely low compared to the electric resistance in the thickness direction of the sintered Ag layer 30. During measurement of the electric resistance, the electric resistance is measured between the central point on the upper surface of the sintered Ag layer 30; and the point apart from the edge part of the sintered Ag layer 30 in the distance H on the circuit layer 12 as shown in FIGS. 6 and 7. The distance H corresponds to the distance from the central point on the upper surface of the sintered Ag layer 30 to the edge part of the sintered Ag layer 30.

In the present embodiment, the thickness $t_o$ of the aluminum oxide film 12A that is naturally formed on the circuit layer 12 is set to 4 nm≤$t_o$≤6 nm. In addition, the thickness $t_g$ of the glass layer 31; the thickness $t_a$ of the Ag layer 32; and the total thickness $t_g+t_a$ of the entire sintered Ag layer 30 are configured to be 0.01 μm≤$t_g$≤5 μm; 1 μm≤$t_a$≤100 μm; and 1.01 μm≤$t_g+t_a$≤105 μm, respectively, as shown in FIG. 3.

Next, the method of producing the power module substrate of the aspect of the present invention is explained.

Figure 8:
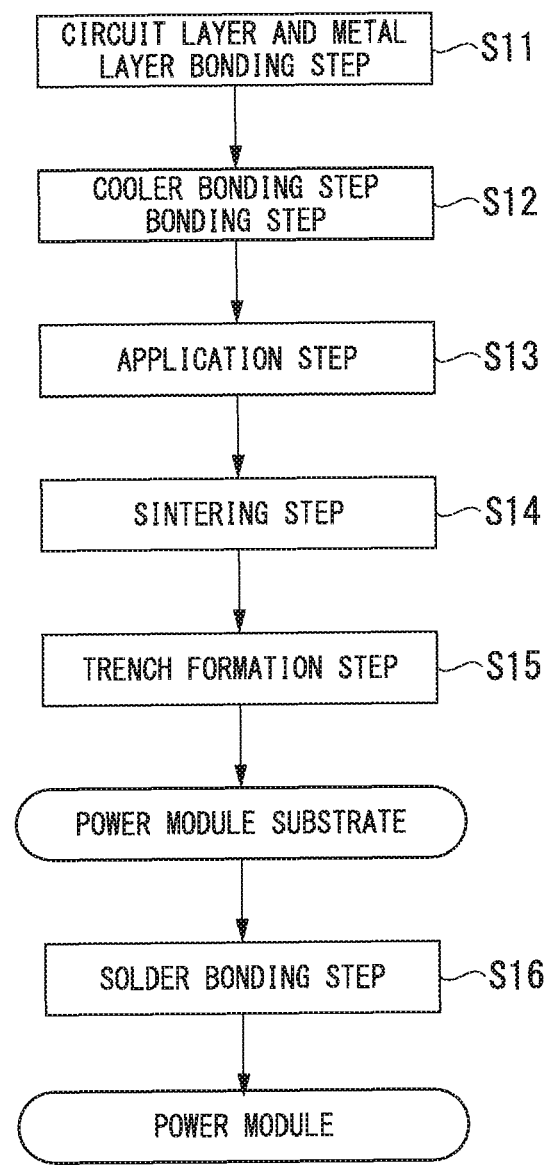
FIG. 8 is a flow chart showing an example of the method of producing the power module substrate of an aspect of the present invention in a step-by-step manner.

FIG. 8 is a flow chart showing an example of the method of producing the power module substrate of the present invention in a step-by-step manner.

First, the aluminum plate to be the circuit layer 12; and the aluminum plate to be the metal plate 13 are prepared. One of these aluminum plates is stacked on one of the one surface 11a and the other on the other surface 11b of the ceramics substrate 11 through the brazing material. Then, these aluminum plates are bonded to the ceramics substrate 11 by cooling after pressurizing and heating (the circuit layer and metal layer bonding step S11). As the brazing material, the Al—Si brazing material or the like can be used, for example. The brazing temperature is set to 640° C. to 650° C., for example.

Next, the cooler 40 (the top plate part 41) is bonded to the other surface side of the metal plate 13 interposed by the buffer layer 15 through the brazing material (the cooler bonding step S12). As the brazing material, the Al—Si brazing material or the like can be used, for example. The brazing temperature of the cooler 40 is set to 590° C. to 610° C., for example.

Then, the Ag paste is applied on the surface 12a of the circuit layer 12 (the application step S13). During application of the Ag paste, various methods, such as the screen printing method, the offset printing method, the photosensitive process and the like, can be used. In the present embodiment, the Ag paste is applied in a pattern by the screen printing method.

The Ag paste used in the application step S13 is explained below. The Ag paste includes: the Ag powder; the glass powder; the resin; the solvent; and the dispersant. The content of the powder components of the Ag powder and the glass powder is set to 60 mass % or more and 90 mass % or less with respect to the entire Ag paste; and the balance is made of the resin, the solvent, and the dispersant.

In the present embodiment, the content of the powder components of the Ag powder and the glass powder is set to 85 mass % with respect to the entire Ag paste. In addition, the viscosity of the Ag paste is adjusted to 10 Pa·s or more and 500 Pa·s or less. More preferably, it is adjusted to 50 Pa·s or more and 300 Pa·s or less.

The grain size of the Ag powder is set to 0.05 μm or more and 1.0 μm or less. In the present embodiment, the average grain size of the Ag powder is set to 0.8 μm.

The glass powder includes one or more of: lead oxide; zinc oxide; silicon oxide; boron oxide; phosphorus oxide; and bismuth oxide, for example. The softening temperature of the glass powder is set to 600° C. or less. In the present embodiment, the glass powder, which is made of lead oxide, zinc oxide, and boron oxide; and has the average grain size of 0.5 μm, is used.

In addition, the weight ratio A/G, which is the ratio of the weight A of the Ag powder to the weight G of the glass powder, is adjusted in the range of 80/20 to 99/1. In the present embodiment, it is set for A/G to be 80/5.

For the solvent, one having the boiling point of 200° C. or more is suitable. In the present embodiment, diethylene glycol dibutyl ether is used.

The resin is for adjusting the viscosity of the Ag paste and one degraded at 500° C. or more is suitable. In the present embodiment, ethyl cellulose is used.

In addition, the dicarboxylic acid-based dispersant is added in the present embodiment. Alternatively, the Ag paste can be configured free of dispersant addition.

For example, in a method of obtaining the Ag paste as configured above, the mixed powder is prepared by mixing the Ag powder and the glass powder; the organic compound mixture is prepared by mixing the solvent and the resin; and the mixed powder, the organic compound mixture, and the dispersant are premixed by a mixer. Then, this premixed mixture is mixed, while it is kneaded by using a roll mill machine. Then, the Ag paste is produced by filtering the obtained kneaded material by a paste filter.

Sintering the Ag paste is performed by putting the Ag paste in the heating furnace in the state where the Ag paste is applied on the surface 12a of the circuit layer 12 (the sintering step S14). The sintering temperature is set to 350° C. to 645° C., for example.

By performing the sintering step S14, the sintered Ag layer 30 including the glass layer 31 and the Ag layer 32 is formed. At this time, the aluminum oxide film 12A, which is naturally formed on the surface of the circuit layer 12, is melted and removed by the glass layer 31; and the glass layer 31 is formed directly on the circuit layer 12. Inside of the glass layer 31, the fine conductive particles 33, particle sizes of which are about several nanometers, are dispersed. These conductive particles 33 are crystalline particles including at least one of Ag and Al; and presumed to be precipitated in the glass layer 31 during sintering.

Next, the trench 35 is formed to connect the peripheral region E2 of the formed sintered Ag layer 30; and the exposed part of the circuit layer 12 stretching out around the periphery of the sintered Ag layer 30 (the trench formation step S15).

Figure 9A:
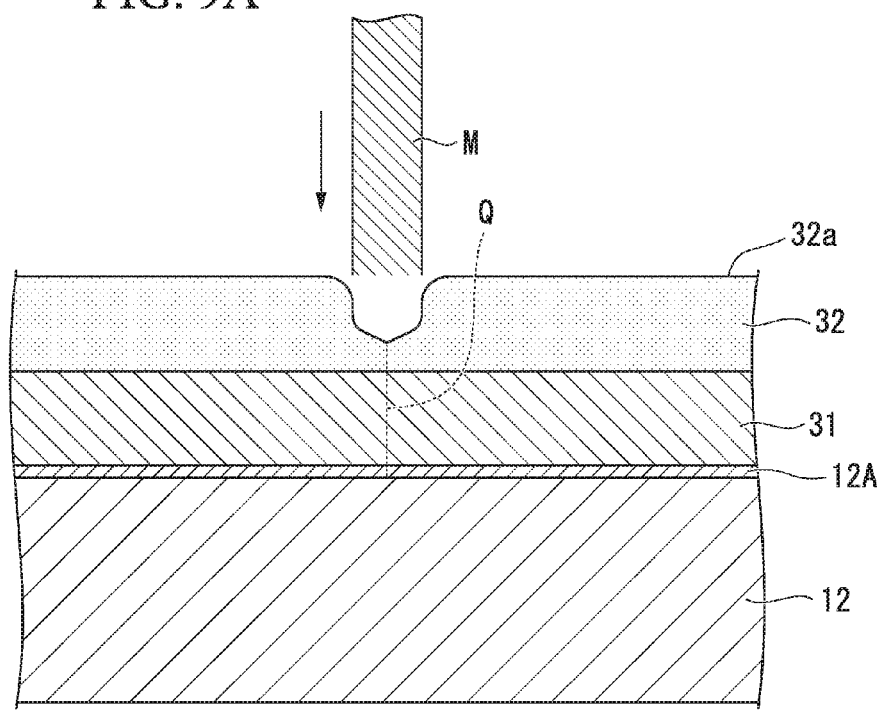
FIG. 9A is an enlarged cross sectional view showing the early stage of the step of forming a slot.
Figure 9B:
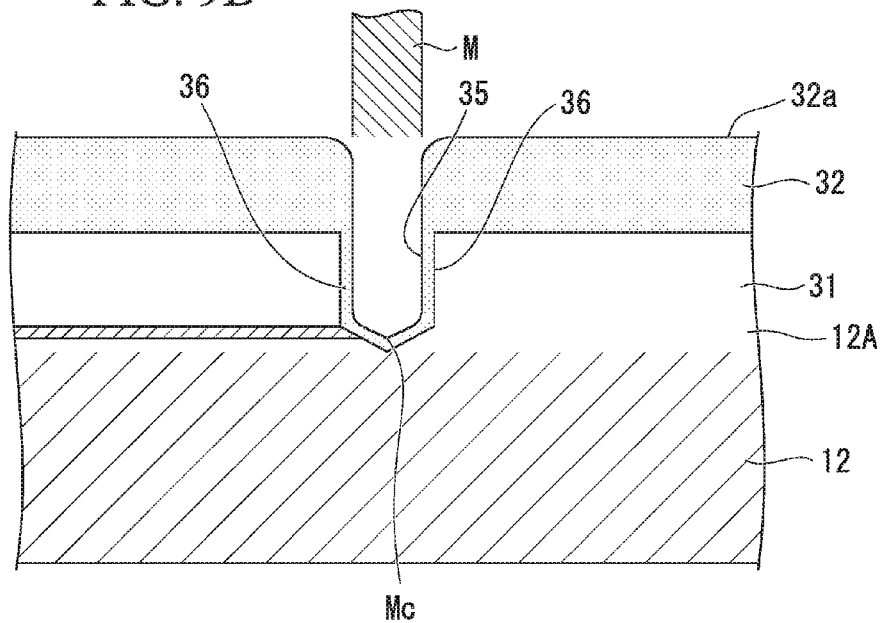
FIG. 9B is an enlarged cross sectional view showing the late stage of the step of forming a slot.

FIGS. 9A and 9B are enlarged cross sectional views of the main sections showing the trench formation step S15 in a step-by-step manner. FIG. 9A is an enlarged cross sectional view of the main section showing the early stage of the trench forming step. FIG. 9B is an enlarged cross sectional view of the main section showing the late stage of the trench forming step.

As shown in FIG. 9A, the hard jig M whose tip is in a pointed shape is pressed from the surface 32a of the Ag layer 32 along with the pre-set guide line Q of the trench 35 formation in the trench forming step S15, for example.

Then, the trench 35 is formed in the sintered Ag layer 30 to the depth where the tip Mc of the jig M reaches to the circuit layer 12, for example to the depth of about 1.00 μm to 100 μm, as shown in FIG. 9B. The pressed edge part of the Ag layer 32 is extended by the jig M and extended to the circuit layer 12 as the extended part 36 connecting to the Ag layer 32 during pressing the jig M from the Ag layer 32. This is because of excellent ductility and ductibility of Ag constituting the Ag layer 32. Because of this, the Ag layer 32 and the circuit layer 12 are electrically connected by Ag having a lower electric resistance value than the glass layer 31.

Then, the jig M is moved from the peripheral region E2 of the sintered Ag layer 30 to the exposed part of the circuit layer 12 stretching out around the periphery of the sintered Ag layer 30 (refer FIG. 4). Because of this, the aluminum oxide film 12A covering the exposed part of the circuit layer 12 is scraped off; and Al of the circuit layer is exposed. At the same time, the exposed Al; and the Ag of the extended part 36 extended from the Ag layer 32 are connected.

As explained above, the trench 35 is formed by forming the linear scribe line from the peripheral region E2 of the sintered Ag layer 30 to the exposed part of the circuit layer 12, in such a way that the Ag layer 32 is pressed down and crushed by the jig M in the trench formation step S15.

By following the processes described above, the power module substrate 10, in which the sintered Ag layer 30 is formed on the surface 12a of the circuit layer 12, is produced.

Then, the semiconductor chip 3 is mounted on the surface 12a of the circuit layer 12 through the solder material; and they are solder-bonded in a reduction furnace (the solder bonding step S16). At this time, a part of or the entire Ag layer 32 constituting the sintered Ag layer 30 is melted in the bonding layer 2 which is formed of the solder material.

Because of this, the power module 1, in which the semiconductor chip 3 is bonded on the circuit layer 12 through the bonding layer 2, is produced.

In the power module substrate 10 and the power module 1 of the present embodiments configured as described above, the trench 35 is formed in such a way that the peripheral region E2 of the sintered Ag layer 30; and the exposed part of the circuit layer 12 stretched out around the periphery of the sintered Ag layer 30, are connected. On the inner surface of the trench 35, the extended part 36, which is made of Ag extended from the Ag layer 32 constituting the sintered Ag layer 30, is formed. Accordingly, the Ag layer 32 and the circuit layer 12 are electrically connected by this extended part 36.

Ag has a lower electric resistance value than the glass layer 31 in which the conductive particles 33 are dispersed. Thus, the electric resistance between the circuit layer and the semiconductor chip 3 is reduced, even if the glass layer 31 having a relatively high electric resistance is formed as the sintered Ag layer 30. Accordingly, electricity can be flown effectively. Because of this, the electric resistance value between the Ag layer 32 and the circuit layer 12 can be kept at a low value even if the glass layer 31 is thickened by increasing the content amount of glass in order to improve the bonding reliability between the circuit layer 12 and the sintered Ag layer 30. Accordingly, both of the bonding reliability and the electric resistance can be balanced.

In addition, the power module 1 of the present embodiment is configured in such a way that the thermal resistance increase rate is less than 2% in the power cycle test, in which 20000 times of the power cycles are loaded, each of the power cycles being performed in the condition of 5 seconds of energization time; and 80° C. of temperature difference. Thus, the bonding layer 2 and the sintered Ag layer 30 are not broken down in the early stage even if they are subjected to the power cycle load; and their reliabilities can be improved.

More specifically, in the case where the power cycles are loaded on the power module 1 repeatedly, partial melting occurs when there is a part having a high electric resistance locally between the circuit layer 12 and the semiconductor chip 3; and melting and coagulation occur at the part repeatedly. It could cause the problem that cracks are formed in the bonding layer 2 or the sintered Ag layer 30 due to the partially melted part being a starting point of the cracks; and the thermal resistance is increased. In the present embodiment, the bonding layer 2 or the sintered Ag layer 30 is not broken down in the early stage even if the power cycles are loaded on the power module 1 repeatedly, since the electric resistance value between the semiconductor chip 3 and the circuit layer 12 is kept at a low value, as explained above. Thus, the reliability against the power cycles can be improved.

The embodiments of the present invention are described above. However, the present invention is not particularly limited by the description of the embodiments, and can be modified as needed within the scope of the present invention based on the technical concept of the present invention.

For example, the case in which the solder layer is used as the bonding layer in the embodiments is explained. However, the present intention is not particularly limited by the description. Thus, for example, the circuit layer and the semiconductor element may be bonded by using a Ag paste including the nano Ag particles and an organic compound as bonding layer.

In addition, 4 trenches 35 are formed as a total in the present embodiment described above, each of them being formed on the middle of each of 4 sides of the sintered Ag layer 30 in the rectangular shape in a plan view. However, the number and the location of the trench formation are not limited by the description. For example, it may be formed on any one side among the 4 sides of the sintered Ag layer in a rectangular shape in a plan view. In addition, multiple trenches may be formed on one side of the sintered Ag layer. In this case, it is preferable that the trenches are formed in such a way that spaces between neighboring two trenches are equal.

In addition, the bottom of the trench 35 is formed in the shape with the obtuse angle in the present embodiment. However, the present invention is not limited by the description, and the bottom shape of the trench may be in a flat shape, or in a shape with a curved surface. In addition, a jip with a proper shape, which has the intended shape of the slot, may be selected as needed in the trench formation step.

In addition, the aluminum plates are named as examples of the circuit layer and the metal layer, both of which are bonded to the ceramics substrate constituting the insulation layer in the present embodiment. However, the present invention is not particularly limited by the description. For example, a copper plate may be used for each of the circuit layer and the metal layer. Alternatively, a copper plate may be used as the circuit layer, and an aluminum plate may be used as the metal layer. In addition, a bonded plate, in which an aluminum plate and a copper plate are bonded in the order from the ceramics substrate side, may be used as the circuit layer or the metal layer.

EXAMPLE

Results of confirmatory tests performed in order to confirm the technical effects of the present invention are explained below.

Example 1

As Example of the present invention, the power module substrate explained in the above-described embodiments of the present invention was prepared.

The trenches 35 were formed in such a way that the peripheral region E2 of the sintered Ag layer 30; and the exposed part of the circuit layer 12 stretched out around the periphery of the sintered Ag layer 30, were connected. Four trenches 35 were formed as a total, each one of them being formed on the middle of one side of 4 sides of the sintered Ag layer 30 in the rectangular shape in a plan view. The length, the depth, and the width of the each trench 35 were 3 mm, 50 μm, and 2 mm, respectively.

As Comparative Example, the power module substrate free of the trench formation was prepared. Except for being free of the slot, the power module substrate of Comparative Example was prepared as in Example of the present invention.

Electric resistance values of the sintered Ag layer in the thickness direction were measured in each of Example of the present invention and Comparative Example.

During electric resistance measurement, the electric resistance was measured between the central point on the upper surface of the sintered Ag layer and the point on the circuit layer apart from the edge part of the sintered Ag layer in the distance H. The distance H corresponded to the distance from the central point on the upper surface of the sintered Ag layer to the edge part of the sintered Ag layer.

Electric resistance values of the sintered Ag layers of Example of the present invention and Comparative Example, which were measured as explained above, are shown in Table 1.

TABLE 1

| | Slot | Electric Resistance |
|---|---|---|
| Example of the present invention | Present | 10 mΩ |
| Comparative Example | Absent | 0.5 Ω |

Based on the results shown in Table 1, the electric resistance value of the sintered Ag layer was reduced to 10 mΩ or less in Example of the present invention while it was 0.5Ω in the conventional sintered Ag layer. Thus, it was confirmed that the electric resistance value was significantly reduced in the present invention. It was confirmed that the power module substrate, which was capable of balancing the both of the bonding reliability and the electric resistance value, could be obtained according to the present invention.

Example 2

The power module substrates of Example of the present invention and Comparative Example used in the above-described Example 1 were prepared. Then, IGBT elements were solder-bonded on the circuit layers of these power module substrates as the semiconductor elements. In addition, heat sinks were provided on the metal layer sides of the power module substrates.

The ceramics substrates, which were made of AlN having the dimension of 27 mm×17 mm and the thickness of 0.6 mm, were used. In addition, the circuit layers, which were made of 4N aluminum having the dimension of 25 mm×15 mm and the thickness of 0.6 mm, were used. The metal layers, which were made of 4N aluminum and the thickness of 0.6 mm, were used. The semiconductors, which were IGBT elements having the dimension of 13 mm×10 mm and the thickness of 0.25 mm, were used. As the heat sinks, aluminum plates (A6063) having the dimension of 40.0 mm×40.0 mm×2.5 mm were used.

The semiconductor elements (IGBT elements) were solder bonded by using the Si—Cu solder as the solder material in the condition of: a 3 vol % hydrogen reduction atmosphere; 330° C. of the heating temperature (the temperature of the object to be heated); and 5 minutes of the retention time.

[Power Cycle Tests]

The energization was adjusted in such a way that one cycle, in which the surface temperature of the element became 140° C. during the energized-state (ON) and 60° C. during the not-energized-state (OFF), was repeated every 10-seconds. Then, the thermal resistance increase rates from the initial states were evaluated. In this Example 2, the power cycle tests were repeated three times.

[Measurement of the Thermal Resistance]

The transient thermal resistance was measured as the thermal resistance by using the thermal resistance tester (Model: 4324-KT manufactured by TESEC Co.). The thermal resistance was measured by measuring voltage difference between the gate and the emitter after applying electricity at the condition of: 100 W of the energization power; and 100 ms of the energization time. The measurement was performed every 50,000-cycles in the above-described power cycle test. The increase rate of the thermal resistance was expressed as the average value of three independent tests. The evaluation results are shown in Table 2.

TABLE 2

| | Thermal Resistance Increase Rate | | |
|---|---|---|---|
| Number of power cycles | 100,000 | 150,000 | 200,000 |
| Example of the present invention | 0% | 0.1% | 0.1% |
| Comparative Example | 1.2% | 1.6% | 2.6% |

In Comparative Example, the increase rate of the thermal resistance exceeded 1% at the time point where the power cycles were repeated 100,000 times. In addition, the higher the cycle number, the higher the thermal resistance.

Contrary to that, there was almost no increase of the thermal resistance even if 200,000 times of the power cycles were loaded in Example of the present invention.

INDUSTRIAL APPLICABILITY

According to the present invention, a power module having excellent reliability and performance can be provided.

REFERENCE SIGNS LIST

1: Power module
2: Bonding layer
3: Semiconductor chip (semiconductor element)
10: Power module substrate
11: Ceramic substrate (insulating layer)
12: Circuit layer
30: Sintered Ag layer
31: Glass layer
32: Ag layer
33: Conductive particle
35: Groove
36: Extended part
E2: Peripheral region

What is claimed is:

1. A power module substrate comprising:
a circuit layer formed on one surface of an insulating layer; and
a sintered Ag layer formed on the circuit layer, wherein
the sintered Ag layer is made of a glass layer and a Ag layer formed on the glass layer,
a trench connecting the Ag layer and the circuit layer is formed, and
the Ag layer has an extended part extending to the circuit layer along with an inner surface of the trench,
the extended part electrically connects the Ag layer and the circuit layer,
the trench is formed to connect a peripheral region of the Ag layer and an exposed part of the circuit layer stretching out around the periphery of the Ag layer, the peripheral region being a region stretching out from an element bonding region of the Ag layer on which a semiconductor element is provided,
the glass layer is formed by the reaction between glass and an oxide film of the circuit layer when a glass-containing Ag paste is applied to the surface of the circuit layer and subjected to sintering, and
conductive particles are dispersed in the glass layer.

2. The power module substrate according to claim 1, wherein
the trench reaches to a location deeper than an oxide film formed on the circuit layer.

3. The power module substrate according to claim 1, wherein
the sintered Ag layer is in a substantially rectangular shape in a planar view, and
the trench is formed on each of four sides of the Ag layer.

4. The power module substrate according to claim 1, wherein a length of the trench along with an extension direction thereof is 0.3 mm or more and 5.0 mm or less.

5. The power module substrate according to claim 1, wherein a depth of the trench along with a thickness direction thereof is 10 μm or more and 200 μm or less.

6. The power module substrate according to claim 1, wherein a width of the trench in a right angle to the extension direction thereof is 5% or more and 75% or less of a length of the side of the sintered Ag layer on which the trench is formed.

7. The power module substrate according to claim 1, wherein an electric resistance value of the sintered Ag layer in a thickness direction thereof is 10 mΩ or less.

8. A power module comprising:
the power module substrate according to claim 1; and
a semiconductor element provided on one surface side of the sintered Ag layer constituting the power module substrate, wherein
the semiconductor element is bonded to the sintered Ag layer through a bonding layer.

9. The power module according to claim 8 wherein a thermal resistance increase rate is less than 2% in a power cycle test in which 200,000 times of power cycles are loaded, each of the power cycles being performed in a condition of: 5 seconds of energization time; and 80° C. of temperature difference.

10. The power module substrate according to claim 1, wherein
the trench is a narrow recessed part.

11. The power module substrate according to claim 1, wherein
the following relationships are satisfied:
0.01 μm ≤ $t_g$ ≤ 5 μm; and
1 μm ≤ $t_a$ ≤ 100 μm, where $t_g$ is a thickness of the glass layer, and $t_a$ is a thickness of the Ag layer.

12. The power module substrate according to claim 1, wherein
the Ag layer is formed on the entire surface of the glass layer.

* * * * *